United States Patent
Hung et al.

(10) Patent No.: US 8,471,383 B2
(45) Date of Patent: Jun. 25, 2013

(54) SEMICONDUCTOR PACKAGE AND FABRICATION METHOD THEREOF

(75) Inventors: Liang-Yi Hung, Taichung (TW); Yu Cheng Pai, Taichung (TW); Ming Chen Sun, Taichung (TW); Chun Hsien Lin, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 108 days.

(21) Appl. No.: 13/242,462

(22) Filed: Sep. 23, 2011

(65) Prior Publication Data
US 2012/0326305 A1 Dec. 27, 2012

(30) Foreign Application Priority Data
Jun. 23, 2011 (TW) .............................. 100121958 A

(51) Int. Cl.
*H01L 23/52* (2006.01)
*H01L 23/48* (2006.01)
*H01L 29/40* (2006.01)

(52) U.S. Cl.
USPC .................. 257/738; 257/E23.069; 257/778; 257/780; 257/781; 438/106; 438/124

(58) Field of Classification Search
CPC ............................... H01L 23/498; H01L 21/56
USPC .................. 257/E23.069, E21.502, 666, 678, 257/723, 738, 766, 778, 780, 781, 787; 438/106, 108, 124, 127, 612
See application file for complete search history.

(56) References Cited

U.S. PATENT DOCUMENTS

| | | | |
|---|---|---|---|
| 5,830,800 A | 11/1998 | Lin | |
| 5,976,912 A * | 11/1999 | Fukutomi et al. | 438/110 |
| 6,306,682 B1 * | 10/2001 | Huang et al. | 438/107 |
| 6,514,847 B1 * | 2/2003 | Ohsawa et al. | 438/614 |
| 6,770,959 B2 | 8/2004 | Huang et al. | |
| 6,872,661 B1 | 3/2005 | Kwan et al. | |
| 6,884,652 B2 * | 4/2005 | Huang et al. | 438/106 |
| 6,933,594 B2 | 8/2005 | McLellan et al. | |
| 6,989,294 B1 | 1/2006 | McLellan et al. | |
| 7,314,820 B2 * | 1/2008 | Lin et al. | 438/617 |
| 7,598,117 B2 * | 10/2009 | Kurita et al. | 438/106 |
| 7,638,879 B2 | 12/2009 | Jiang et al. | |
| 7,934,313 B1 * | 5/2011 | Lin et al. | 29/841 |
| 8,338,231 B2 * | 12/2012 | Meyer-Berg | 438/108 |
| 8,354,598 B2 * | 1/2013 | Liu | 174/255 |
| 2004/0256739 A1 * | 12/2004 | Hashimoto | 257/778 |
| 2006/0214308 A1 * | 9/2006 | Yu et al. | 257/778 |
| 2007/0114661 A1 * | 5/2007 | Choi et al. | 257/737 |

* cited by examiner

*Primary Examiner* — Chris Chu
(74) *Attorney, Agent, or Firm* — Edwards Wildman Palmer LLP; Peter F. Corless; Steven M. Jensen

(57) ABSTRACT

A semiconductor package includes: a dielectric layer having opposing first and second surfaces and side surfaces; a copper wiring layer disposed on the first surface of the dielectric layer and having extension pads; a surface processing layer disposed on the wiring layer; a semiconductor chip disposed on the wiring layer and electrically connected to the surface processing layer; and an encapsulant disposed on the first surface of the dielectric layer for encapsulating the semiconductor chip, the wiring layer and the surface processing layer while exposing the second surface of the dielectric layer. Further, vias are disposed between the side surfaces of the dielectric layer and the encapsulant such that the extension pads are exposed from the vias so as for solder balls to be disposed thereon. Due to improved electrical connection between the copper and solder materials, the electrical connection quality of the package is improved.

16 Claims, 5 Drawing Sheets

SEMICONDUCTOR PACKAGE AND FABRICATION METHOD THEREOF

CROSS-REFERENCES TO RELATED APPLICATIONS

This application claims under 35 U.S.C. §119(a) the benefit of Taiwanese Application No. 100121958, filed Jun. 23, 2011, the entire contents of which is incorporated herein by reference.

BACKGROUND OF THE INVENTION

1. Field of the Invention

The present invention relates to semiconductor packages, and, more particularly, to a carrier-free semiconductor package.

2. Description of Related Art

Conventionally, there are various kinds of semiconductor packages that use lead frames as chip carriers. For example, a QFN (Quad Flat Non-leaded) semiconductor package is a lead frame-based chip scale package, which is characterized in that the leads thereof do not extend out from the package sides as in a conventional quad flat package (QFP), thereby reducing the size of the semiconductor package.

However, due to the thickness of the encapsulant of the QFN package, the height of the QFN package cannot be further reduced to meet the demands for lighter, thinner and smaller semiconductor products. Therefore, carrier-free semiconductor packages have been developed, which are much lighter and thinner compared with conventional lead frame semiconductor packages.

FIG. 1 shows a carrier-free semiconductor package as disclosed by U.S. Pat. No. 5,830,800. Referring to FIG. 1, a plurality of conductive pads 14 are formed on a copper plate (not shown) by electroplating, and a semiconductor chip 16 having a plurality of electrode pads is disposed on the copper plate and electrically connected to the conductive pads 14 through a plurality of bonding wires 17. Further, a molding process is performed to form an encapsulant 18. Then, the copper plate is removed to expose the conductive pads 14. Subsequently, a solder mask layer 11 is formed to define positions of the conductive pads 14 so as for a plurality of solder balls 19 to be mounted on the conductive pads 14, respectively. As a result, a semiconductor package 1 is obtained. Related techniques are also disclosed in U.S. Pat. Nos. 6,770,959, 6,989,294, 6,933,594 and 6,872,661.

In the above-described semiconductor package, the number of conductive pads substantially corresponds to the number of the electrode pads of the semiconductor chip, such that the electrode pads can be electrically connected to the corresponding conductive pads, respectively. However, if a highly integrated chip is used, since the electrode pads of the chip are configured at a high density, a higher number of conductive pads are required, thus increasing the distance between the conductive pads and the chip and increasing the length of the wire loops of the bonding wires. Long bonding wires complicates the wire bonding process. Further, impacted by molding flow during the molding process, long bonding wires may easily sweep or shift so as to come into contact with each other, thereby easily short circuiting and adversely affecting the electrical connection quality of the semiconductor package. Furthermore, a long distance between the conductive pads and the semiconductor chip may complicate the wire bonding process and even cause failure of the wire bonding process. In addition, long bonding wires increase material costs.

Accordingly, U.S. Pat. No. 7,638,879 discloses an RDL (redistribution layer) technique through which conductive pads can be extended to the periphery of a semiconductor chip so as to reduce the lengths or interlacing of bonding wires and reduce material costs. Referring to FIG. 2, a dielectric layer 21 is formed on a carrier 20 of copper through an attaching layer 200, and a plurality of openings 210 are formed in the dielectric layer 21 and filled with Ni/Au material 25. Then, a copper wiring layer 24 is formed on the dielectric layer 21 and the Ni/Au material 25 by electroplating. The wiring layer 24 has conductive pads 241 formed at ends thereof. Subsequently, a semiconductor chip 26 is disposed on the dielectric layer 21 and electrically connected to the conductive pads 241 through bonding wires 27. Then, an encapsulant 28 is formed to encapsulate the semiconductor chip 26 and the bonding wires 27. Finally, the carrier 20 and the attaching layer 200 are removed to expose the dielectric layer 21 and the Ni/Au material 25.

Further, a solder material (not shown) can be attached to the Ni/Au material 25 for connecting a circuit board (not shown). However, the electrical connecting and heat dissipating effects between the Ni/Au material 25 and the solder material are quite poor, which results in a low electrical connection quality for the semiconductor package.

Further, the carrier 20 of copper is quite expensive, thereby resulting in higher material costs.

Furthermore, when the semiconductor package 2 is disposed on a circuit board, a solder paste having a thickness of 0.1 mm must be formed on conductive pads of the circuit board first and then attached to the Ni/Au material 25. However, if warpage occurs to the semiconductor package 2, a too thin layer of solder paste prevents the Ni/Au material 25 from being reliably attached thereto, thus resulting in a poor electrical connection of the semiconductor package.

Therefore, there is a need to provide a carrier-free semiconductor package and a fabrication method thereof so as to overcome the above-described drawbacks.

SUMMARY OF THE INVENTION

Accordingly, the present invention provides a semiconductor package, which comprises: a dielectric layer having a first surface and a second surface opposite to the first surface and side surfaces adjacent to the first and second surfaces; a wiring layer made of copper and disposed on the first surface of the dielectric layer; a surface processing layer disposed on the wiring layer; a semiconductor chip disposed on the wiring layer and electrically connected to the wiring layer and the surface processing layer; and an encapsulant disposed on the first surface of the dielectric layer for encapsulating the semiconductor chip, the wiring layer and the surface processing layer while exposing the second surface of the dielectric layer, wherein vias are disposed between the side surfaces of the dielectric layer and the encapsulant such that portions of the surface processing layer are located in the vias.

In the above-described semiconductor package, the wiring layer can further comprise extension circuits each having a first conductive pad disposed at one end and an extension pad disposed at the other end such that the first conductive pads are located on the first surface of the dielectric layer, and the extension pads are located on the surface processing layer and exposed from the vias.

In the above-described package, the wiring layer can further comprise a plurality of second conductive pads disposed on the first surface of the dielectric layer so as for the semiconductor chip to be disposed thereon. Further, the dielectric layer can comprise a plurality of openings in communication with the first and second surfaces thereof so as to expose portions of the wiring layer.

The present invention further provides a fabrication method of a semiconductor package, which comprises the steps of: providing a carrier and defining on a surface of the carrier a carrier region and an extension region adjacent to the carrier region; forming a dielectric layer on the carrier region, wherein the dielectric layer has an exposed first surface, a second surface attached to the carrier and side surfaces adjacent to the first and second surfaces; forming a wiring layer of copper on the first surface of the dielectric layer and portions of the extension region of the carrier, wherein the wiring layer comprises extension circuits each having a first conductive pad formed at one end and an extension pad formed at the other end such that the first conductive pads are located on the first surface of the dielectric layer and the extension pads are located on the extension region of the carrier; forming a surface processing layer on the wiring layer; disposing a semiconductor chip on the first surface of the dielectric layer and electrically connecting the semiconductor chip and the surface processing layer; forming an encapsulant on the carrier and the first surface of the dielectric layer for encapsulating the semiconductor chip and the wiring layer such that the extension pads are located between the side surfaces of the dielectric layer and the encapsulant on the extension region; removing the carrier to expose the second surface of the dielectric layer and expose the extension pads from the second surface of the dielectric layer and the encapsulant; and removing portions of the extension pads so as to form vias between the side surfaces of the dielectric layer and the encapsulant.

In the above-described method, said forming the wiring layer and the surface processing layer can further comprise the step of: forming a resist layer on the first surface of the dielectric layer and the carrier and forming a plurality of first openings in the resist layer for exposing portions of the extension region of the carrier and portions of the first surface of the dielectric layer in communication with the extension region; forming the wiring layer in the first openings; forming the surface processing layer on the wiring layer; and removing the resist layer for exposing portions of the extension region of the carrier.

The above-described method can further comprise the step of forming a plurality of second openings in the resist layer for exposing additional portions of the first surface of the dielectric layer and forming the wiring layer in the second openings of the resist layer. Furthermore, before forming the resist layer, the method can further comprise forming a plurality openings in the dielectric layer for exposing portions of the surface of the carrier, wherein the openings of the dielectric layer are in communication with the second openings of the resist layer so as for the wiring layer of copper to be formed therein. Therefore, after removing the carrier, the method can further comprise removing the copper material in the openings of the dielectric layer such that portions of the wiring layer are exposed from the openings to serve as second conductive pads. The step of removing portions of the extension pads can further comprise removing portions of the second conductive pads in the openings of the dielectric layer so as to form solder balls in the openings of the dielectric layer. In addition, the method can comprise removing the remaining portions of the extension pads so as to expose the surface processing layer in the vias.

In the above-described semiconductor package and fabrication method thereof, a plurality of solder balls can be formed in the vias, respectively. The surface processing layer can comprise a gold layer disposed on the wiring layer, a nickel layer disposed on the gold layer, and a gold material, a lead material or a silver material disposed on the nickel layer.

According to the present invention, the extension pads of the wiring layer made of copper are exposed from the vias so as for the solder balls to be disposed thereon. Due to improved electrical connection between the copper material and the solder material and an increased heat dissipating effect, the present invention enhances the electrical connecting quality of the semiconductor package.

Further, the carrier of the present invention is made of an iron alloy or a copper alloy, the cost of which is lower than that of pure copper used in the prior art, thereby reducing material costs.

Furthermore, to dispose the semiconductor package of the present invention on a circuit board, solder balls can be formed on the extension pads in the vias first and then attached to a solder paste having a thickness of 0.1 mm. As such, even if warpage of the semiconductor package occurs, in that the solder balls can be reliably attached to the solder paste, the present invention effectively avoids the conventional problem of poor electrical connection.

DETAILED DESCRIPTION OF PREFERRED EMBODIMENTS

The following illustrative embodiments are provided to illustrate the disclosure of the present invention and its advantages, these and other advantages and effects being apparent to those in the art after reading this specification.

It should be noted that the drawings are not intended to limit the present invention. Various modification and variations can be made without departing from the spirit of the present invention. Further, terms such as "one", "above", etc. are merely for illustrative purposes and should not be construed to limit the scope of the present invention.

FIGS. 3A to 3I show a fabrication method of a semiconductor package according to the present invention.

Figure 1:
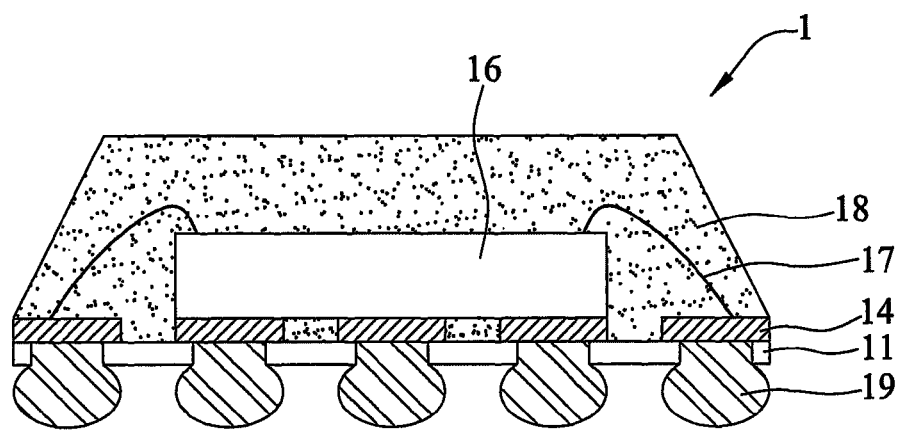
FIG. 1 is a schematic cross-sectional view showing a carrier-free semiconductor package disclosed by U.S. Pat. No. 5,830,800.
Figure 2:
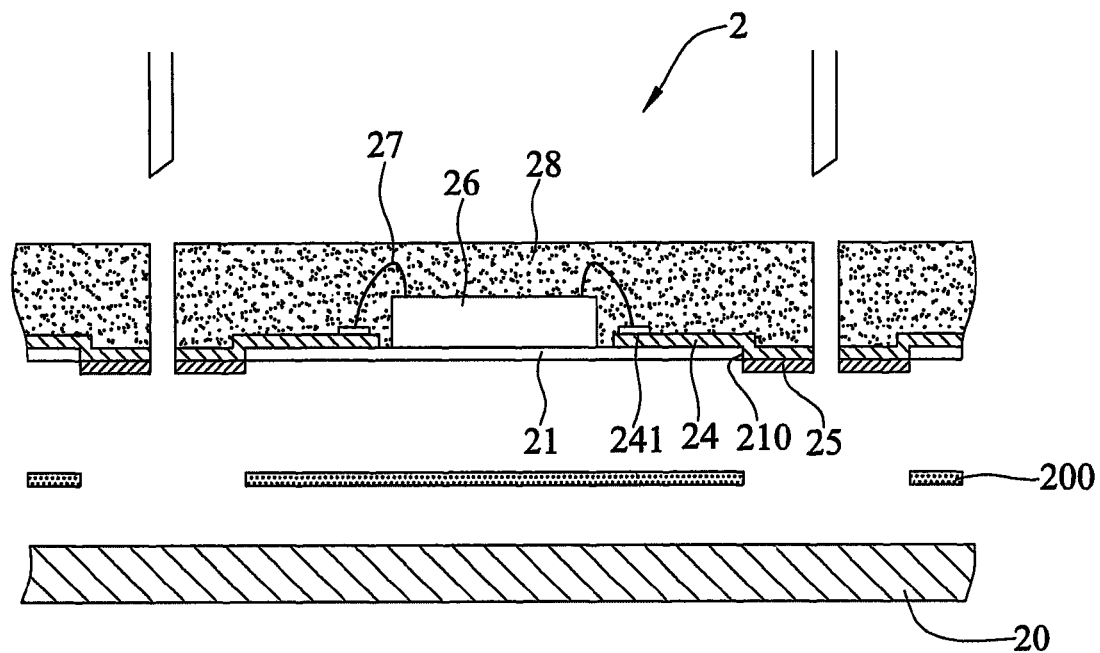
FIG. 2 is a schematic cross-sectional view showing a carrier-free semiconductor package disclosed by U.S. Pat. No. 7,638,879.
Figure 3A:
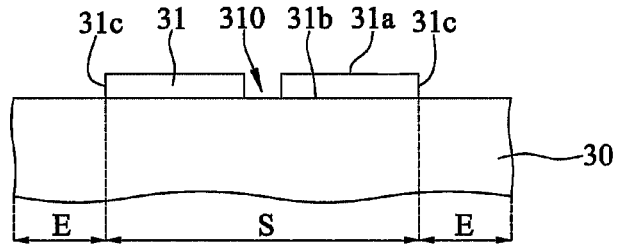
FIGS. 3A to 3I' are schematic cross-sectional views showing a fabrication method of a carrier-free semiconductor package according to the present invention, wherein FIG. 3D($a$) is a partially enlarged view of FIG. 3D, and FIGS. 3H' and 3I' show other embodiments of FIGS. 3H and 3I, respectively.

Referring to FIG. 3A, a carrier 30 made of an iron alloy or a copper alloy is provided, and a carrier region S and an extension region E adjacent to the carrier region S are defined on a surface of the carrier 30.

Subsequently, a dielectric layer 31 is formed on the carrier region S and patterned to form a plurality of openings 310 in the dielectric layer 31 for exposing portions of the carrier region S. Although only one opening 310 is exemplified in the drawing, the present invention is not limited thereto. In the present embodiment, the dielectric layer 31 has an exposed first surface 31$a$ (upper surface), a second surface 31$b$ (lower surface) opposite to the first surface 31a and attached to the carrier board 30, and side surfaces 31c adjacent to the first surface 31a and the second surface 31b.

Figure 3B:
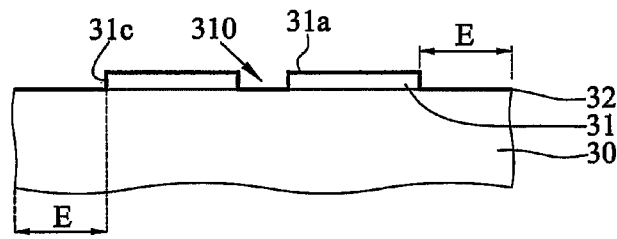

Referring to FIG. 3B, a conductive layer 32 is formed on the first surface 31a and the side surfaces 31c, in the openings 310 of the dielectric layer 31 and on the extension region E.

Figure 3C:
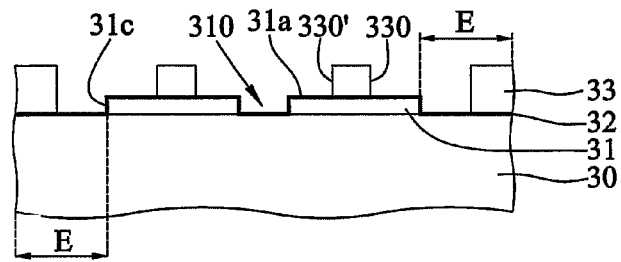

Referring to FIG. 3C, a resist layer 33 is formed on the conductive layer 32 and a plurality of first openings 330 are formed in the resist layer 33 for exposing portions of the conductive layer 32 on the extension region E and portions of the conductive layer 32 on the side surfaces 31c and the first surface 31a of the dielectric layer 31 in communication with the extension region E.

In the present embodiment, the resist layer 33 further has a plurality of second openings 330' for exposing additional portions of the first surface 31a of the dielectric layer 31, and the second openings 330' are in communication with the openings 310 of the dielectric layer 31 for exposing the conductive layer 32 in the openings 310.

Figure 3D:
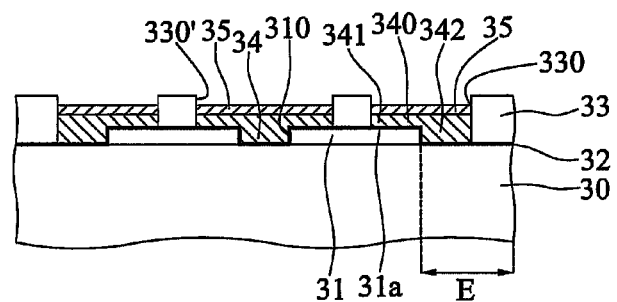
Figure 3D:
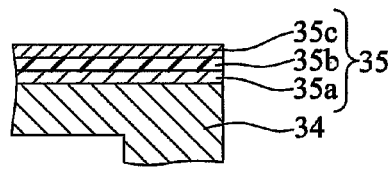

Referring to FIG. 3D, a wiring layer 34 of copper is formed on the conductive layer 32 in the first and second openings 330, 330' of the resist layer 33 and in the openings 310 of the dielectric layer 31. The wiring layer 34 has a plurality of extension circuits 340 each having a first conductive pad 341 formed at one end and an extension pad 342 formed at the other end such that the first conductive pads 341 are located on the first surface 31a of the dielectric layer 31 and the extension pads 342 are located on the extension region E of the carrier 30.

Subsequently, a surface processing layer 35 is formed on the wiring layer 34. In the present embodiment, referring to FIG. 3D(a), the surface processing layer 35 has a gold layer 35a formed on the wiring layer 34, a nickel layer 35b formed on the gold layer 35a and a gold material, a lead material or a silver material 35c formed on the nickel layer 35b.

Figure 3E:
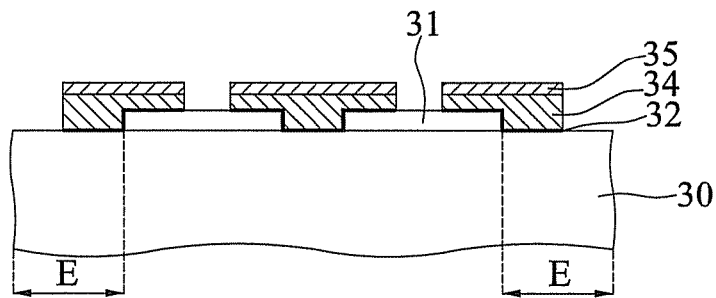

Referring to FIG. 3E, the resist layer 33 and the conductive layer 32 covered by the resist layer 33 are removed to expose portions of the extension region E of the carrier 30.

Figure 3F:
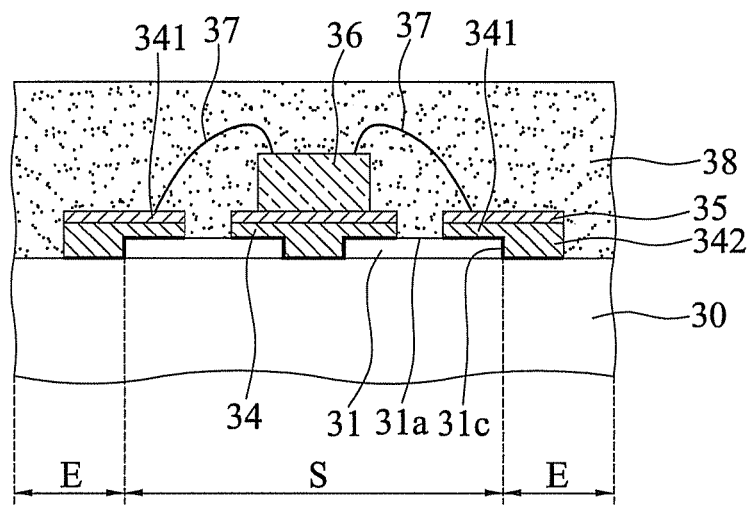

Referring to FIG. 3F, a semiconductor chip 36 is disposed on the wiring layer 34 on the carrier region S and electrically connected to the surface processing layer 35 through a plurality of bonding wires 37. In other embodiments, the semiconductor chip can be electrically connected to the surface processing layer through a flip-chip manner.

Subsequently, an encapsulant 38 is formed on the exposed portions of the extension region E of the carrier 30 and the first surface 31a of the dielectric layer 31 for encapsulating the semiconductor chip 36, the bonding wires 37 and the wiring layer 34 such that the extension pads 342 are located between the side surfaces 31c of the dielectric layer 31 and the encapsulant 38 on the extension region E.

Figure 3G:
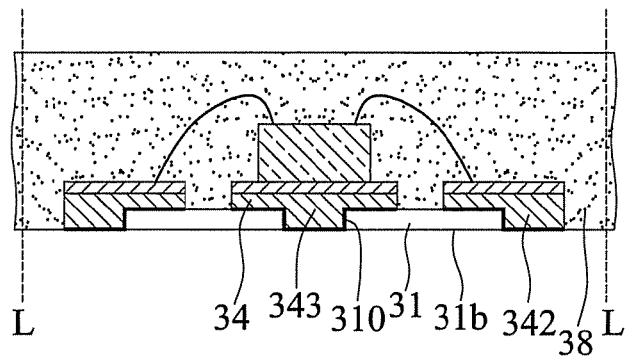

Referring to FIG. 3G the carrier 30 is removed to expose the second surface 31b of the dielectric layer 31 and expose the extension pads 342 from the second surface 31b of the dielectric layer 31 and the encapsulant 38. In addition, portions of the wiring layer 34 are also exposed from the openings 310 of the dielectric layer 31 so as to serve as second conductive pads 343.

Figure 3H:
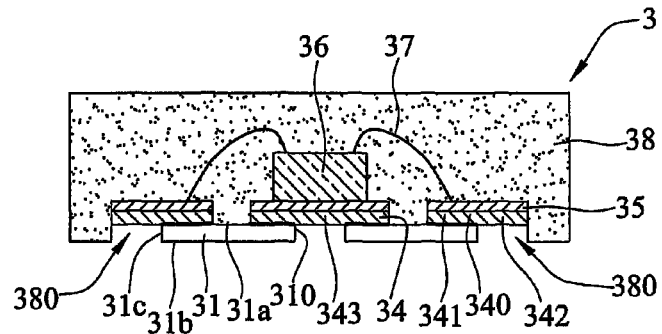
Figure 3H:
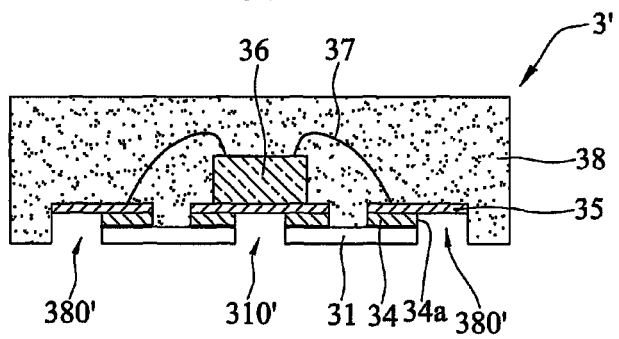

Referring to FIG. 3H, portions of the extension pads 342 and the conductive layer 32 thereon are removed to form vias 380 between the side surfaces 31c of the dielectric layer 31 and the encapsulant 38, and the copper material in the openings 310 of the dielectric layer 31 is removed to expose the second conductive pads 343.

In another embodiment, the remaining portions of the extension pads 342 and the second conductive pads 343 are removed so as to expose the surface processing layer 35 from the vias 380' and the openings 310', as shown in FIG. 3H'.

Further, a singulation process is performed along cutting lines L of FIG. 3G to obtain a semiconductor package 3, 3'.

Figure 3I:
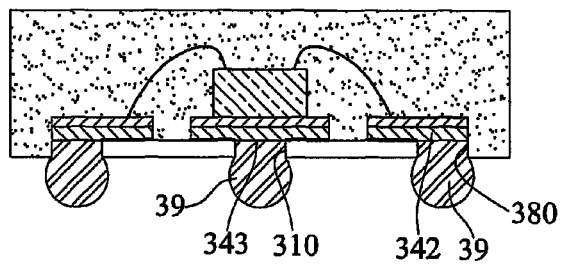
Figure 3I:
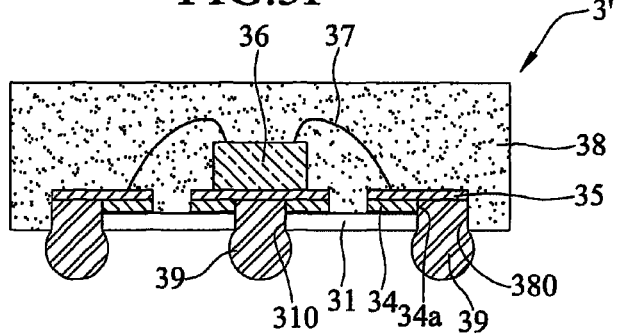

Referring to FIG. 3I, a plurality of solder balls 39 are formed on the extension pads 342 in the vias 380 and on the second conductive pads 343 in the openings 310.

Further, if the semiconductor chip 36 is not electrically connected to the second conductive pads 343, the second conductive pads 343 can be used for heat dissipation. On the other hand, if the semiconductor chip 36 is electrically connected to the second conductive pads 343, the second conductive pads 343 can be used for electrical conduction and heat dissipation.

Referring to FIG. 3I', the solder balls 39 are formed on the surface processing layer 35 (the gold layer 35a) in the vias 380 or in the openings 310 so as to be attached to side surfaces 34a of the wiring layer 34, thereby improving the electrical connecting and heat dissipating effects.

The present invention further provides a semiconductor package 3, 3', which has: a dielectric layer 31 having a first surface 31a and a second surface 31b opposite to the first surface 31a and side surfaces 31c adjacent to the first surface 31a and the second surface 31b; a wiring layer 34 made of copper and disposed on the first surface 31a of the dielectric layer 31; a surface processing layer 35 disposed on the wiring layer 34; a semiconductor chip 36 disposed on the wiring layer 34 and electrically connected to the wiring layer 34 and the surface processing layer 35; and an encapsulant 38 disposed on the first surface 31a of the dielectric layer 31 for encapsulating the semiconductor chip 36, the wiring layer 34 and the surface processing layer 35 while exposing the second surface 31b of the dielectric layer 31. Further, vias 380, 380' are disposed between the side surfaces 31c of the dielectric layer 31 and the encapsulant 38 so as for solder balls 39 to be disposed therein.

In an embodiment, portions of the surface processing layer 35 are located in the vias 380, and the wiring layer 34 has extension circuits 340 each having a first conductive pad 341 disposed at one end and an extension pad 342 disposed at the other end such that the first conductive pads 341 are located on the first surface 31a of the dielectric layer 31 and the extension pads 342 are located on the surface processing layer 35 and exposed from the vias 380.

In another embodiment, portions of the surface processing layer 35 are exposed from the vias 380'.

In the semiconductor package 3, 3', the wiring layer 34 has a plurality of second conductive pads 343 disposed on the first surface 31a of the dielectric layer 31 and the semiconductor chip 36 is disposed on the second conductive pads 343. Further, the second surface 31b of the dielectric layer 31 has a plurality of openings 310, 310' in communication with the first surface 31a and the second surface 31b for exposing portions of the wiring layer 34 (second conductive pads 343) or the surface processing layer 35. Furthermore, a plurality of solder balls 39 are formed in the openings 310, 310' for electrically connecting the wiring layer 34.

In addition, the surface processing layer 35 has a gold layer 35a disposed on the wiring layer 34, a nickel layer 35b disposed on the gold layer 35a, and a gold, lead or silver material 35c disposed on the nickel layer 35b.

According to the present invention, the extension pads 342 are exposed from the vias 380 and the second conductive pads 343 are exposed from openings 310 so as for the solder balls 39 to be disposed on the extension pads 342 and the second conductive pads 343. Due to improved electrical connection between the copper material of the extension pads 342 and the solder material of the solder balls 39, the present invention enhances the electrical connecting quality of the semiconductor package and achieves a better heat-dissipating effect.

Further, the carrier 30 of the present invention is made of an iron alloy or a copper alloy, the cost of which is lower than that of pure copper used in the prior art, thereby reducing material costs.

Figure 4:
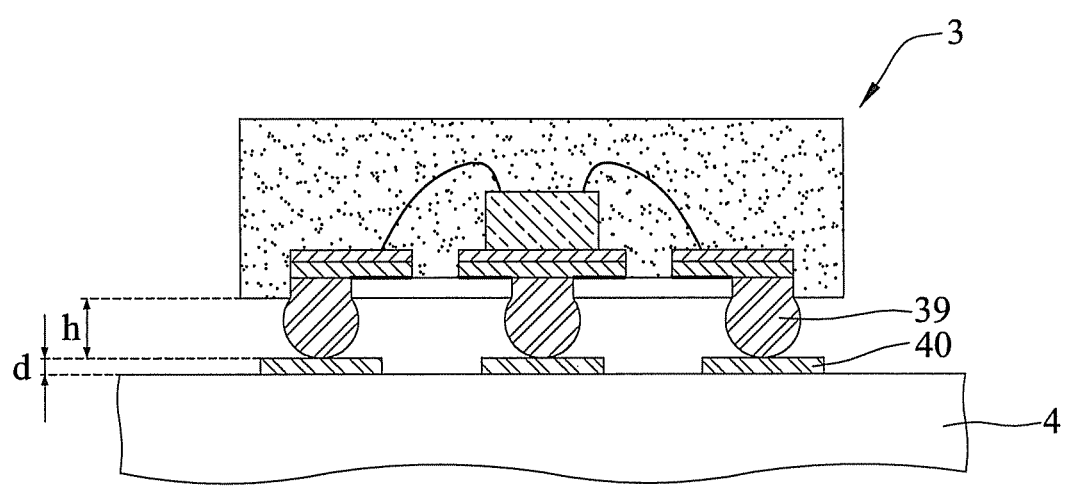
FIG. 4 is a schematic cross-sectional view of a semiconductor package disposed on a circuit board according to the present invention.

Furthermore, referring to FIG. 4, in order to dispose the semiconductor package 3 of the present invention on a circuit board 4, the solder balls 39 on the extension pads 342 are attached to a solder paste 40 having a thickness d of 0.1 mm. However, the height h of the solder balls 39 protruding above the dielectric layer is 0.3 mm, which results in a greater stand-off distance between the semiconductor package and the circuit board. As such, even if warpage occurs to the semiconductor package 3, in that the solder balls 39 can be reliably attached to the solder paste 40, the present invention can effectively avoid the conventional problem of poor electrical connection.

The above-described descriptions of the detailed embodiments are provided to illustrate the preferred implementation according to the present invention and are not intended to limit the scope of the present invention. Accordingly, many modifications and variations completed by those with ordinary skill in the art will fall within the scope of present invention as defined by the appended claims.

What is claimed is:

1. A semiconductor package, comprising:
   a dielectric layer having a first surface and a second surface opposite to the first surface and side surfaces adjacent to the first and second surfaces;
   a wiring layer made of copper and disposed on the first surface of the dielectric layer;
   a surface processing layer disposed on the wiring layer;
   a semiconductor chip disposed on the wiring layer and electrically connected to the wiring layer and the surface processing layer; and
   an encapsulant disposed on the first surface of the dielectric layer for encapsulating the semiconductor chip, the wiring layer and the surface processing layer while exposing the second surface of the dielectric layer, wherein vias are disposed between the side surfaces of the dielectric layer and the encapsulant such that portions of the surface processing layer are located in the vias.

2. The package of claim 1, wherein the wiring layer further comprises extension circuits each having a first conductive pad disposed at one end and an extension pad disposed at the other end such that the first conductive pads are located on the first surface of the dielectric layer and the extension pads are located on the surface processing layer and exposed from the vias.

3. The package of claim 1, wherein the wiring layer further comprises a plurality of second conductive pads disposed on the first surface of the dielectric layer so as for the semiconductor chip to be disposed thereon.

4. The package of claim 1, wherein the dielectric layer further comprises a plurality of openings in communication with the first and second surfaces thereof so as to expose portions of the wiring layer.

5. The package of claim 4, further comprising a plurality of solder balls disposed in the openings of the dielectric layer for electrically connecting the wiring layer.

6. The package of claim 1, wherein the surface processing layer comprises a gold layer disposed on the wiring layer, a nickel layer disposed on the gold layer, and a gold material, a lead material or a silver material disposed on the nickel layer.

7. The package of claim 1, further comprising a plurality of solder balls disposed in the vias, respectively.

8. A fabrication method of a semiconductor package, comprising the steps of:
   providing a carrier and defining on a surface of the carrier a carrier region and an extension region adjacent to the carrier region;
   forming a dielectric layer on the carrier region, wherein the dielectric layer has an exposed first surface, a second surface attached to the carrier and side surfaces adjacent to the first and second surfaces;
   forming a wiring layer of copper on the first surface of the dielectric layer and portions of the extension region of the carrier, wherein the wiring layer comprises extension circuits each having a first conductive pad formed at one end and an extension pad formed at the other end such that the first conductive pads are located on the first surface of the dielectric layer and the extension pads are located on the extension region of the carrier;
   forming a surface processing layer on the wiring layer;
   disposing a semiconductor chip on the first surface of the dielectric layer and electrically connecting the semiconductor chip and the surface processing layer;
   forming an encapsulant on the carrier and the first surface of the dielectric layer for encapsulating the semiconductor chip and the wiring layer such that the extension pads are located between the side surfaces of the dielectric layer and the encapsulant on the extension region;
   removing the carrier to expose the second surface of the dielectric layer and expose the extension pads from the second surface of the dielectric layer and the encapsulant; and
   removing portions of the extension pads so as to form vias between the side surfaces of the dielectric layer and the encapsulant.

9. The method of claim 8, wherein the carrier is made of an iron alloy or a copper alloy.

10. The method of claim 8, wherein said forming the wiring layer and the surface processing layer comprises the step of:
    forming a resist layer on the first surface of the dielectric layer and the carrier and forming a plurality of first openings in the resist layer for exposing portions of the extension region of the carrier and portions of the first surface of the dielectric layer in communication with the extension region;
    forming the wiring layer in the first openings;
    forming the surface processing layer on the wiring layer; and
    removing the resist layer for exposing portions of the extension region of the carrier.

11. The method of claim 10, further comprising the step of forming a plurality of second openings in the resist layer for exposing additional portions of the first surface of the dielectric layer and forming the wiring layer in the second openings of the resist layer.

12. The method of claim 11, further comprising, before forming the resist layer, forming a plurality openings in the dielectric layer for exposing portions of the surface of the carrier, wherein the openings of the dielectric layer are in communication with the second openings of the resist layer so as for the wiring layer of copper to be formed therein, therefore, after removing the carrier, the method further comprises removing the copper material in the openings of the dielectric layer such that portions of the wiring layer are exposed from the openings to serve as second conductive pads.

13. The method of claim 12, wherein the step of removing portions of the extension pads further comprises removing portions of the second conductive pads in the openings of the dielectric layer so as to form solder balls in the openings of the dielectric layer.

14. The method of claim 8, wherein the surface processing layer comprises a gold layer formed on the wiring layer, a nickel layer formed on the gold layer, and a gold material, a lead material or a silver material formed on the nickel layer.

15. The method of claim 8, further comprising removing the remaining portions of the extension pads so as to expose the surface processing layer in the vias.

16. The method of claim 8, further comprising forming a plurality of solder balls in the vias, respectively.

* * * * *